(12) United States Patent
Shiraishi

(10) Patent No.: US 7,479,690 B2
(45) Date of Patent: Jan. 20, 2009

(54) SEMICONDUCTOR DEVICE

(75) Inventor: Yasushi Shiraishi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 55 days.

(21) Appl. No.: 11/488,190

(22) Filed: Jul. 18, 2006

(65) Prior Publication Data

US 2007/0020999 A1 Jan. 25, 2007

(30) Foreign Application Priority Data

Jul. 22, 2005 (JP) ............................. 2005-212442

(51) Int. Cl.
*H01L 23/552* (2006.01)

(52) U.S. Cl. ................ 257/659; 257/297; 257/422; 257/508; 257/660; 257/787; 257/E21.502; 257/E23.114

(58) Field of Classification Search ............... 257/297, 257/422, 508, 659, 660, 787, E21.502, E23.114
See application file for complete search history.

(56) References Cited

U.S. PATENT DOCUMENTS 6,501,169 B1 * 12/2002 Aoki et al. ................. 257/700

| | | | |
|---|---|---|---|
| 2003/0127704 A1 * | 7/2003 | Kobayashi et al. | 257/531 |
| 2004/0222487 A1 * | 11/2004 | Tanabe et al. | 257/508 |
| 2005/0139981 A1 * | 6/2005 | Kobayashi et al. | 257/690 |

FOREIGN PATENT DOCUMENTS

| JP | 2003-243570 | 8/2003 |
| JP | 2004-031790 | 1/2004 |
| JP | 2004-214561 | 7/2004 |

\* cited by examiner

*Primary Examiner*—Andy Huynh
(74) *Attorney, Agent, or Firm*—Rabin & Berdo, PC

(57) ABSTRACT

Strip metallic thin films each having a width of 180 μm or so are disposed in parallel at intervals of 10 μm to 50 μm on the surface of a protection layer formed on the silicon substrate and at their corresponding spots located on the upper side of an analog circuit formed in a silicon substrate. These strip metallic thin films are connected to one another at their ends or centers to form a comb-like shield section and one end thereof is connected to its corresponding external connecting post. Incidentally, the shield section is formed by copper plating in the same process as redistribution wirings that connect electrode pads at an outer peripheral portion of the silicon substrate to their corresponding external connecting posts. Since the encapsulating resin and the protection layer are reliably adhered to each other when the upper portions of the redistribution wirings and the shield section are sealed with the encapsulating resin, the shield section is adhered to the encapsulating resin and has no fear of being peeled therefrom.

16 Claims, 2 Drawing Sheets

SEMICONDUCTOR DEVICE

BACKGROUND OF THE INVENTION

The present invention relates to a semiconductor device of a CSP (Chip Size Package) type, and particularly to a structure of a redistribution wiring layer for the semiconductor device.

FIG. 2 is a configurational view of a conventional semiconductor device described in, for example, one (Japanese Unexamined Patent Publication No. 2004-31790) of patent documents 1, 2 and 3 (Japanese Unexamined Patent Publication Nos. 2004-31790, 2004-214561 and 2003-243570), wherein FIG. 2(a) is a plan view thereof, and FIG. 2(b) is a sectional view of a portion taken along line X-X in FIG. 2(a).

The present semiconductor device is of a CSP type and includes respective circuit blocks for a power supply circuit 51, an operational amplifier 52, a comparison amplifier 53, an analog circuit of an RF transmit-receive section 54 and a digital circuit of a logic section 55 all formed in its circuit forming surface. The semiconductor device has an IC 1 in which a large number of input/output terminals 2 are arranged at its outer peripheral portion. A first insulating layer 3 is formed on the circuit forming surface of the IC 1, and a redistribution wiring layer 4 is formed on the first insulating layer 3. The redistribution wiring layer 4 is constituted of a large number of bump setting wirings 4a having one ends connected to the input/output terminals 2 via through holes 5, and shield sections 4b which respectively cover the surfaces of the power supply circuit 51 and the comparison amplifier 53.

Bumps 6 are set to the other ends of the bump setting wirings 4a. The entire surfaces of the first insulating layer 3 and the redistribution wiring layer 4 are covered with a second insulating layer 7 so as to expose the heads of the bumps 6. Incidentally, the redistribution wiring layer 4 is formed of a copper plate having a thickness of 5 μm or so, and the bumps 6 are formed of solder balls. The present semiconductor device is flip-chip packaged by bonding the bumps 6 to their corresponding wirings 9 formed on a mounting board 8 as shown in FIG. 2(b).

Since the surfaces of the power supply circuit 51 and the comparison amplifier 53 formed on the circuit forming surface of the IC 1 are covered with the shield sections 4b formed of a copper plating film in the semiconductor device, the power supply circuit 51 and the comparison amplifier 53 can be protected from externally-incoming noise, thereby making it possible to improve the stability of the operation of semiconductor device.

A semiconductor device having a configuration in which in order to further enhance a shield effect and improve high-frequency characteristics, a shield section 4b is formed over substantially the entire surface of a circuit forming surface of an IC 1 except for portions for forming input/output terminals 2 and portions for forming bump setting wirings 4a, and the shield section 4b is connected to power supply terminals, has also been described in the patent document 1.

SUMMARY OF THE INVENTION

In the semiconductor device, the shield section 4b is formed so as to cover the entire surface of a shield region using the copper plating film for the redistribution wiring layer 4. Since, however, the adhesion between copper and an encapsulating resin is essentially poor, the adhesion between the shield section 4b and an encapsulating portion such as the second insulating layer 7 that covers the shield section 4b is degraded when the area of the copper plating film of the shield section 4b increases, and failures such as peeling, etc. occur due to the difference in thermal expansion coefficient and the like, thus degrading moisture resistance. Therefore, a problem arises in that the reliability of a product is deteriorated. The present invention aims to provide a semiconductor device which prevents impairment of the adhesion between a shield section and an encapsulating portion and has a redistribution wiring layer which brings about a shield effect.

According to one aspect of the present invention, for attaining the above object, there is provided a semiconductor device comprising:

a silicon substrate having a plurality of electrode pads formed at an outer peripheral portion thereof and circuit blocks including an analog circuit formed in an inner circuit forming surface;

an insulating layer formed over the surface of the silicon substrate;

a plurality of redistribution wirings formed over the surface of the insulating layer and formed of a metallic thin film, the redistribution wirings performing electrical connections between the electrode pads and external connecting predetermined positions;

a shield section in which a plurality of strip metallic thin films are disposed in parallel at predetermined intervals at spots where the strip metallic thin films are placed over the surface of the insulating layer and on the upper side of the analog circuit, the ends or centers of these strip metallic thin films are connected to one another, and one end of the thus-obtained connected portion is extended to an external connecting predetermined position;

metallic posts formed in the external connecting predetermined positions, for electrically and mechanically connecting the redistribution wirings and the shield section to the outside; and an encapsulating resin which exposes leading ends of the metallic posts and seals side surfaces of the metallic posts, the insulating layer, the redistribution wirings and the shield section.

In the present invention, the shield section in which the strip metallic thin films are disposed and formed in parallel is provided so as to cover the analog circuit. Thus, since the insulating layer and the encapsulating resin are adhered to each other with the strip metallic thin films interposed therebetween, the peeling between the encapsulating resin and the metallic thin films is avoided as in the shield section having a wide area. Accordingly, advantageous effects are brought about in that degradation of moisture resistance can be prevented and the reliability of a product can be enhanced.

The width of each redistribution wiring and the width of each metallic thin film of the shield section are identical and set to 180 μm or less, and they are manufactured in the same process. Further, the interval between the plural respective strip metallic thin films constituting the shield section is set to 10 μm even at the minimum and set so as not to exceed 50 μm.

The above and other objects and novel features of the present invention will become more completely apparent from the following descriptions of preferred embodiment when the same is read with reference to the accompanying drawings. The drawings, however, are for the purpose of illustration only and by no means limitative of the invention.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The present invention will hereinafter be described with reference to the accompanying drawings.

First Preferred Embodiment

Figure 1:
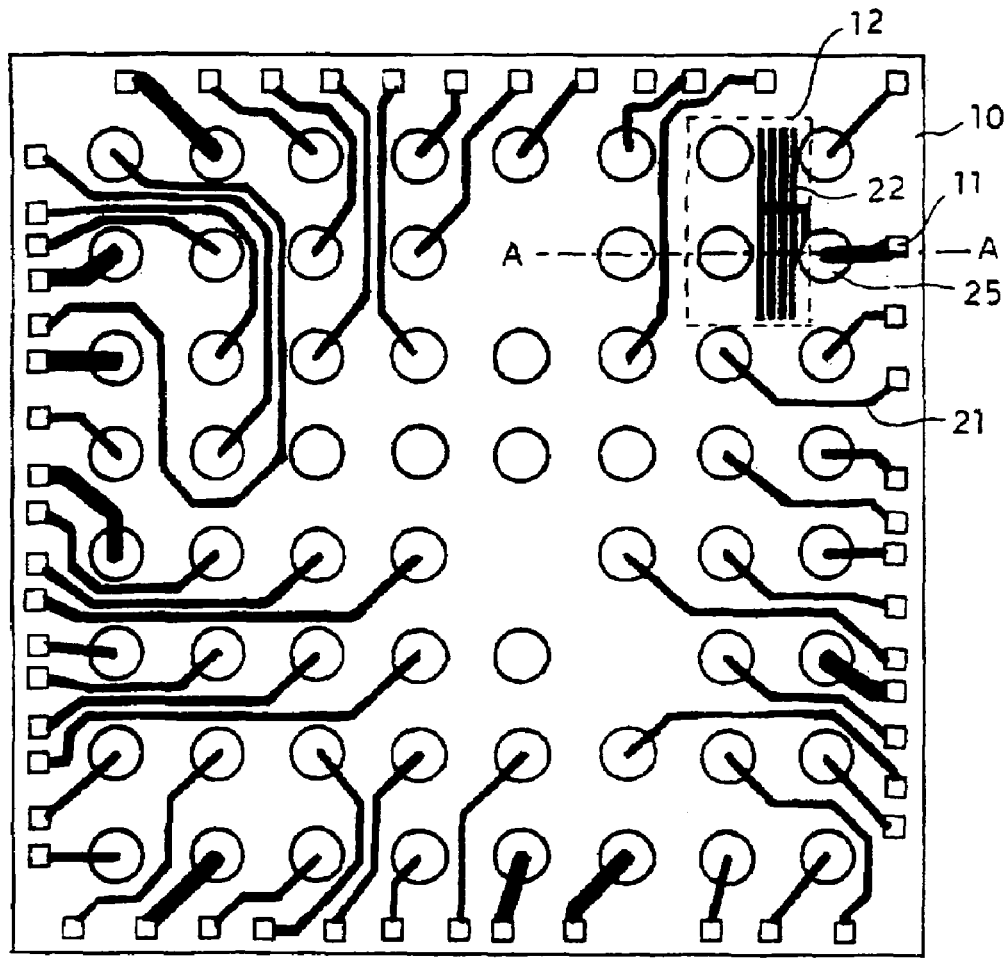
FIG. 1 is a configurational view of a semiconductor device showing an embodiment of the present invention.
Figure 1:
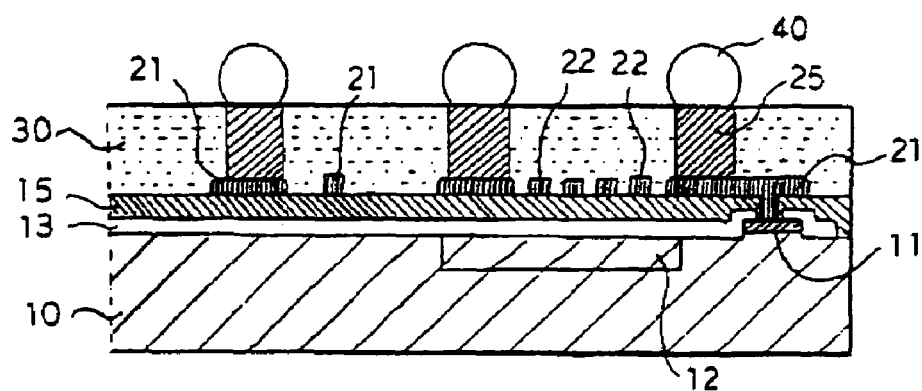
Figure 2A:
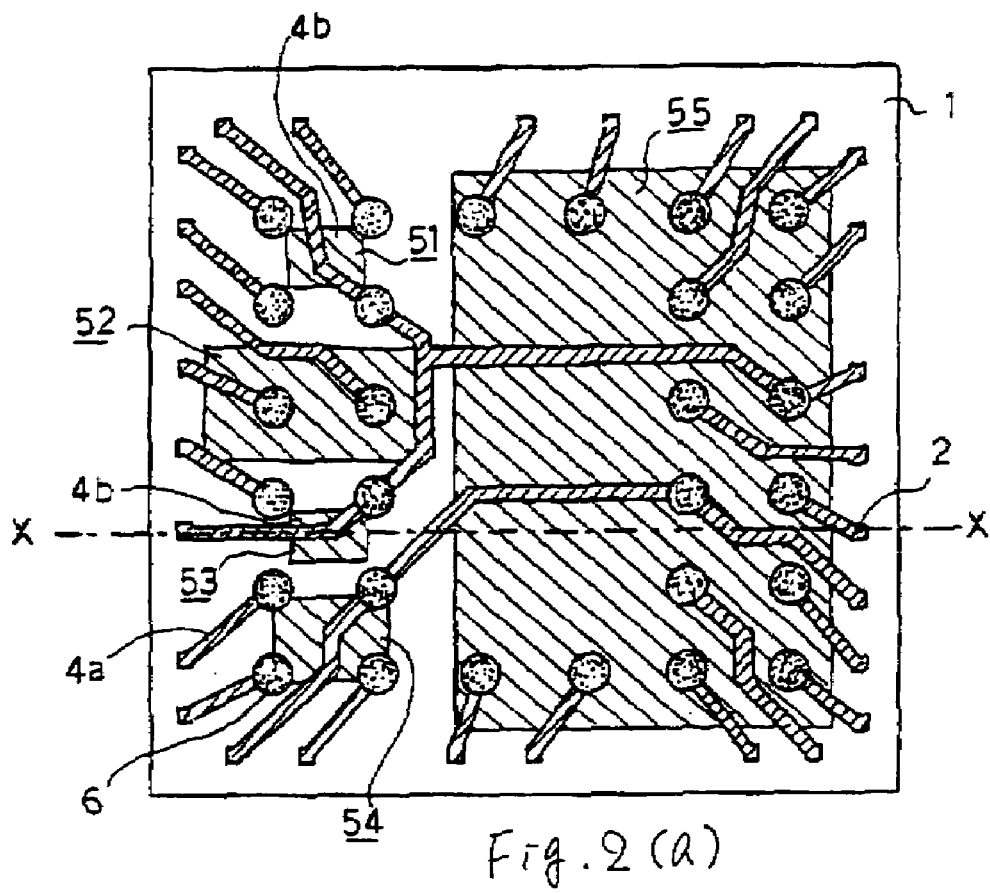
FIG. 2 is a configurational view of a conventional semiconductor device.
Figure 2B:
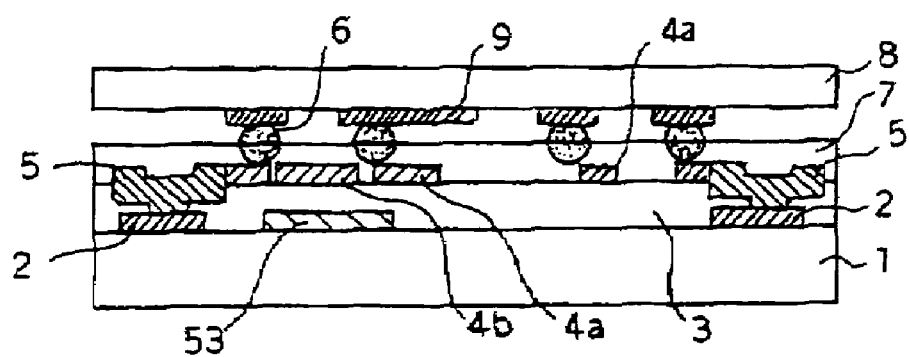

FIG. 1 is a configurational view of a semiconductor device showing an embodiment of the present invention, wherein FIG. 1(a) is a plan view thereof, and FIG. 1(b) is an enlarged sectional view of a portion taken along line A-A in FIG. 1(a).

The semiconductor device is one of a CSP type and has a silicon substrate 10 in which a large number of electrode pads 11 are arranged in its outer peripheral portion and circuit elements are formed in an internal circuit forming surface. An analog circuit 12 including, for example, an operational amplifier, an analog/digital converter, a digital/analog converter, a phase-locked loop, etc., and circuit blocks such as a digital circuit, etc. other than ones referred to above are formed in the circuit forming surface. A passivation film 13 comprised of, for example, a silicon nitride film is formed on the surface of the silicon substrate 10. Openings or apertures corresponding to the electrode pads 11 are defined in the passivation film 13. The surfaces of the electrode pads 11 are exposed from the apertures.

An insulative protection layer 15 made up of, for example, polyimide is formed on the passivation film 13. The thickness of the protection layer 15 is 5 μm or so.

Redistribution wirings 21 plated with copper are formed on the protection layer 15. The redistribution wirings 21 are wirings formed of a metallic thin film, which perform electrical connections from the electrode pads 11 compactly arranged at the outer peripheral portion of the silicon substrate 10 to external connecting predetermined positions placed dispersively over the entire surface of the silicon substrate 10, in order to reliably connect the semiconductor device to a mounting board. The thickness of each redistribution wiring 21 is 5 μm or so and the width thereof is 180 μm or so. Further, a shield section 22 formed by copper plating simultaneously with the redistribution wirings 21 is disposed on the surface of the protection layer 15 placed on the upper side of the analog circuit 12. The shield section 22 is connected to a ground potential or a predetermined potential such as a source potential to shield the analog circuit 12 from electromagnetic noise produced from outside or the digital circuit or the like. The shield section 22 is obtained by placing in parallel, a plurality of linear wirings each having a thickness of 5 μm or so and a width of 180 μm or so, connecting these at the central part or end thereof and forming the same in a comb fashion. The interval between the teeth of the comb-shaped shield section 22 is set to a dimension between 10 μm and 50 μm.

One end of each redistribution wiring 21 is connected to the electrode pad 11 via the aperture defined in the passivation film 13. The other end of the redistribution wiring 21 corresponds to a portion formed as a bed or base of each of posts 25 and is configured as a circular form having a diameter of 270 μm or so. On the other hand, the other end of a wiring for connecting the teeth of the comb-shaped shield section 22 is formed as a circular form having a diameter of 270 μm or so as a bed or base of the ground post 25.

Each of the posts 25 is a columnar conductor formed by, for example, copper plating to electrically and mechanically connect the semiconductor device to the mounting board. The diameter of the post 25 is 250 μm or so and the height thereof is 100 μm or so.

The protection layer 15, the redistribution wirings 21, the shield section 22 and the posts 25 are entirely sealed with an encapsulating resin 30 except for the leading ends of the posts 25. And metallic electrodes such as solder balls 40 or the like are provided at the leading ends of the posts 25, which are exposed from the surface of the encapsulating resin 30.

A brief outline of a semiconductor device manufacturing method will next be explained.

The present semiconductor device can be manufactured in the same process as a normal CSP manufacturing method.

That is, a silicon wafer is first manufactured wherein electrode pads 11 are arranged in an outer peripheral portion and a large number of integrated circuits each formed with circuit elements of an analog circuit 12 and a digital circuit are disposed in an internal circuit forming surface. A passivation film 13 comprised of a silicon nitride film is formed on the surface of the silicon wafer.

Next, a protection layer 15 consisting of polyimide is formed over the entire surface of the passivation film 13 of the silicon wafer. And openings or apertures are defined in the protection layer 15 by etching such that the electrode pads 11 on the silicon wafer are exposed.

Further, a copper thin film having a thickness of 5 μm or so is formed over the entire surface of the silicon wafer formed with the protection layer 15 by an electroplating method. At this time, the openings of the protection layer 15 are filled with copper plating, and the electrode pads 11 are connected to the copper thin film formed by plating. The copper thin film is etched using a resist mask to simultaneously form the redistribution wirings 21 and the shield section 22.

After the formation of the redistribution wirings 21 and the shield section 22, copper posts 25 are formed by the electroplating method using a plating mask. After the removal of the plating mask, the whole surface of the silicon wafer is covered with an encapsulating resin 30. Further, the surface of the encapsulating resin 30 is flatly cut by cutting to expose the surfaces of the posts 25. And solder balls 40 are mounted onto the exposed surfaces of the posts 25 to form electrodes.

Thereafter, the silicon wafer is brought into fractionization to complete each semiconductor device.

The semiconductor device is used as a flip-chip package by bonding the solder balls 40 to their corresponding wirings formed in the mounting board. At this time, the posts 25 connected with the shield section 22 are connected to a ground potential or a source potential to thereby effectively shield noise produced from outside or the digital circuit.

In the semiconductor device according to the present embodiment as described above, the linear wirings whose widths are 180 μm or so are disposed in parallel in plural form, and the shield section 22 obtained by connecting these wirings at their centers or ends and forming the same in comb form is disposed so as to cover the upper portion of the analog circuit 12. Further, the interval between the teeth of the comb-shaped shield section 22 is set to 50 μm or less. Thus, an advantage is brought about in that noise to the analog circuit 12 can effectively be shielded.

In addition, the width of the copper plate or coat constituting the shield section 22 is 180 μm identical to that of the copper plate constituting each redistribution wiring 21, and the interval between the teeth constituting the comb-shaped shield section 22 is set to 10 μm or more. Thus, the protection layer 15 and the encapsulating resin 30 that interpose the comb-shaped shield section 22 therebetween is bonded to each other. The adhesion of the shield section 22 to the encapsulating resin 30 becomes the same degree as that between the redistribution wirings 21 and the encapsulating resin 30, thus bringing about an advantage in that degradation in adhesion due to the provision of the shield section 22 does not occur.

Incidentally, the present invention is not limited to the above embodiment, and various modifications can be made thereto. As examples of the modifications, the following may be mentioned, for example.

(1) Various dimensions are shown by way of example and hence no restrictions are imposed on the illustrated values. However, the setting of the line width of each redistribution wiring 21 and the width between the comb-shaped teeth constituting the shield section 22 to the same size is effective in terms of pattern design and quality control. The line width of the redistribution wiring 21 may preferably be 180 μm or less from the viewpoint of adhesion.

(2) Wiring widths of 180 μm or more are needed at spots where large current flows through the redistribution wirings 21 for a power supply or ground or the like. Making slits of 10 μm or so at such points every wiring widths of, for example, 180 μm enables retention of the adhesion between the redistribution wirings and the encapsulating resin 30.

What is claimed is:

1. A semiconductor device comprising:
   a silicon substrate having a plurality of electrode pads formed at an outer peripheral portion thereof and circuit blocks including an analog circuit formed in an inner circuit forming surface;
   an insulating layer formed over the surface of the silicon substrate;
   a plurality of redistribution wirings formed over the surface of the insulating layer and formed from a metallic thin film, said redistribution wirings connecting the electrode pads to predetermined external connecting positions;
   a shield section in which a plurality of strip metallic conductors are disposed in parallel at predetermined intervals over the analog circuit, the ends or centers of these strip metallic conductors being connected to one another, and the shield section having a portion that is connected to an external connecting position;
   metallic posts at the external connecting positions, for electrically and mechanically connecting the redistribution wirings and the shield section to the outside; and
   an encapsulating resin which exposes leading ends of the metallic posts and seals side surfaces of the metallic posts, the insulating layer, the redistribution wirings and the shield section, the encapsulating resin being disposed directly on the strip metallic conductors.

2. The semiconductor device according to claim 1, wherein the redistribution wirings and the strip metallic conductors of said shield section are identical in width and are manufactured in the same process.

3. The semiconductor device according to claim 2, wherein the widths of the metallic conductors of the redistribution wiring and the shield section are 180 μm or less, and the intervals between the metallic conductors of the shield section range from 10 μm to 50 μm.

4. The semiconductor device according to claim 1, wherein the redistribution wiring and the metallic strip conductors lie in a common plane.

5. A semiconductor device comprising:
   a semiconductor substrate having a first surface with electrode pads and circuit blocks including an analog circuit;
   a shield layer including a plurality of strip metallic conductors which are disposed at predetermined intervals over the analog circuit and which are electrically connected to one another;
   a resin layer over the first surface of the semiconductor substrate and the shield layer, the resin layer being disposed directly on the strip metallic conductors; and
   external terminals electrically connected to the electrode pads.

6. The semiconductor device according to claim 5, wherein the electrode pads and the external terminals are connected to one another via redistribution wiring conductors disposed above the first surface of the semiconductor substrate.

7. The semiconductor device according to claim 6, wherein the shield layer is formed of the same material as the redistribution wiring conductors.

8. The semiconductor device according to claim 6, wherein the redistribution wiring conductors and the strip metallic conductors lie in a common plane.

9. The semiconductor device according to claim 5, wherein the plurality of strip metallic conductors of the shield layer are disposed in parallel with one another.

10. The semiconductor device according to claim 9, wherein the strip metallic conductors are disposed at equal intervals from one another.

11. The semiconductor device according to claim 9, wherein the strip metallic conductors are disposed in parallel with one another and wherein the equal intervals range from 10 μm to 50 μm.

12. The semiconductor device according to claim 5, wherein the shield layer is connected to a ground potential.

13. A semiconductor device, comprising:
    a substrate having a plurality of circuit blocks and electrode pads that are disposed at predetermined pad positions and that are electrically connected to the electrode pads, the circuit blocks including a particular circuit block;
    redistribution conductors that are disposed in a common plane and that extend from locations over the pad positions to connection post positions;
    a conductive shield section over the particular circuit block, the shield section lying in the common plane;
    connection posts having upper and lower ends; the lower ends being connected to the redistribution conductors at the connection post positions; and
    a resin layer that contacts the redistribution conductors and the shield section, the connection posts extending through the resin layer,
    wherein the particular circuit block comprises analog circuitry.

14. The semiconductor according to claim 13, wherein the shield section comprises a plurality of elongated shield conductors and means for electrically connecting the shield conductors.

15. The semiconductor device according to claim 14, wherein the shield conductors are disposed parallel to one another at equal intervals.

16. The semiconductor device according to claim 15, wherein the equal intervals range from 10 μm to 50 μm.

* * * * *